United States Patent [19]
Wong et al.

[11] Patent Number: 5,917,361
[45] Date of Patent: Jun. 29, 1999

[54] METHOD AND APPARATUS FOR REDUCING NOISE IN AN OUTPUT BUFFER

[75] Inventors: Jeffrey F. Wong; Wassem Ahmad, both of Fremont, Calif.

[73] Assignee: VLSI, Technology, San Jose, Calif.

[21] Appl. No.: 08/770,471

[22] Filed: Dec. 20, 1996

[51] Int. Cl.[6] .................................................. H03K 17/16
[52] U.S. Cl. ........................... 327/391; 327/110; 326/26; 326/27
[58] Field of Search .................................. 326/26, 27, 86, 326/87; 327/391, 108, 110

[56] References Cited

U.S. PATENT DOCUMENTS

| | | | |
|---|---|---|---|
| 4,988,888 | 1/1991 | Hirose et al. | 307/443 |
| 5,214,320 | 5/1993 | Truong | 307/443 |
| 5,319,260 | 6/1994 | Wanlass | 307/443 |
| 5,414,379 | 5/1995 | Kwon | 327/170 |
| 5,426,376 | 6/1995 | Wong et al. | 326/27 |
| 5,438,277 | 8/1995 | Sharpe-Geisler | 326/27 |
| 5,585,740 | 12/1996 | Tipon | 326/26 |

FOREIGN PATENT DOCUMENTS

WO094026031  11/1994  WIPO ....................................... 326/26

Primary Examiner—Timothy P. Callahan
Assistant Examiner—An T. Luu
Attorney, Agent, or Firm—Hickman Stephens & Coleman, LLP

[57]  ABSTRACT

A low-noise output buffer in accordance with the present invention includes pre-driver circuitry coupled to core circuitry of an integrated circuit, output circuitry having a variable drive level that is responsive to the pre-driver output signal and powered by a first power supply, and noise reduction control circuitry coupled to the first power supply. The noise reduction control circuitry is powered by a second power supply which has less noise than the first power supply, and is arranged to develop a control signal that is coupled to the output circuitry to modify the drive level of the output circuitry to counteract noise detected on the first power supply. In some embodiments, the noise reduction control circuitry includes a first transistor and the output circuitry includes a second transistor which are arranged to form a stacked transistor pair.

15 Claims, 4 Drawing Sheets

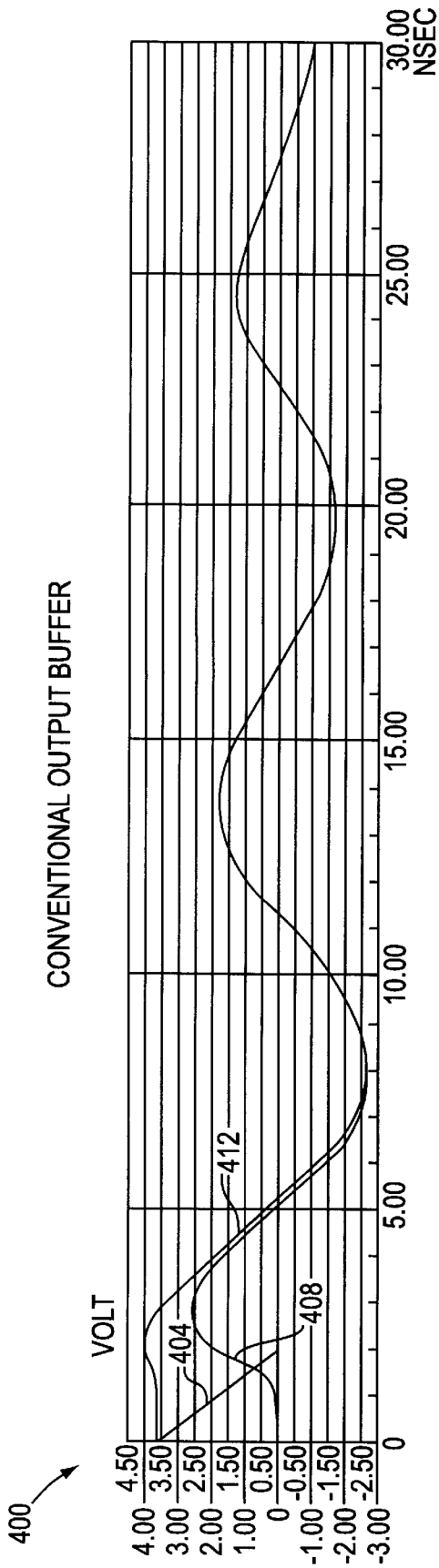
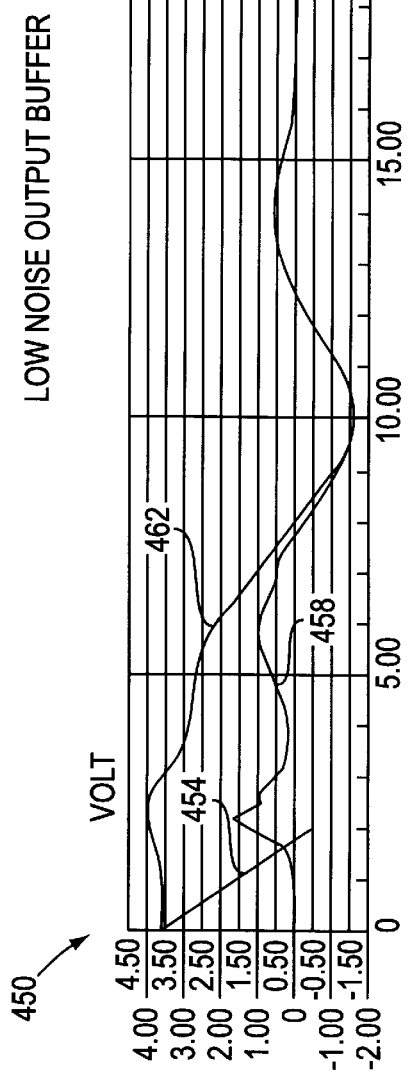
FIG. 4A
FIG. 4B

METHOD AND APPARATUS FOR REDUCING NOISE IN AN OUTPUT BUFFER

TECHNICAL FIELD

This invention relates generally to integrated circuitry, and more particularly to a method and apparatus for reducing noise in output buffers of integrated circuits.

BACKGROUND ART

Output buffers are often used in integrated circuits to convert an input signal with a relatively high resistance to an output signal with a relatively low resistance. For example, output buffers can be used to develop signals representing data on a computer data bus in a microprocessor-based electronic system. When an input signal with a relatively high resistance is converted into an output signal with a relatively low resistance by an output buffer, the output signal generally draws a higher current than the input signal. As a result, the output of an output buffer can be used to drive inputs of other integrated circuit chips, connected, for example, to the computer data bus.

A conventional output buffer circuit 10 is shown in FIG. 1 and includes a switching output buffer 13 with, for example, ten output buffers (10×). An output signal 22 of output buffer 13 varies as an input 23 to output buffer 13 varies. The frequency of the variation in output 22 is dependent, at least in part, upon the slew rate of the output, as will be appreciated by those of skill in the art. Output buffer 13 is connected to a ground ($V_{SS}$) bus 14 and a voltage supply ($V_{DD}$) bus 16. Further, in this example, output buffer 13 drives a capacitance load represented as a capacitor $10C_L$.

Conventional output buffer circuit 10 also includes non-switching buffers 15 and 17. As shown, an input 18 of non-switching buffer 15 is tied "low," e.g. tied to ground Vss bus. Hence, an output signal 25 of non-switching buffer 15 is ideally low. Also as shown, with an input 19 of non-switching buffer 17 tied high, e.g. to $V_{DD}$ bus 16, an output 27 of non-switching buffer 17 is high. It should be appreciated that $V_{DD}$ bus 16 carries a noisy voltage signal, as a pin inductance, i.e. inductor 32, coupled to a voltage supply $V_{DD}$ pin 33 creates noise due to current flowing through $V_{DD}$ bus 16. Similarly, $V_{SS}$ bus 14 carries a noisy ground signal, due to the fact that a pin inductance, i.e. inductor 34, coupled to a ground supply $V_{SS}$ pin 35 creates noise due to current flowing through $V_{SS}$ bus 14. That is, inductors 32 and 34 represent the inductance of bond wires and package pins for voltage supply $V_{DD}$ pin 33 and ground supply $V_{SS}$ pin 35, respectively.

In general, non-switching buffers 15 and 17 serve the same purpose as output buffer 13. That is, non-switching buffers 15 and 17 can also drive loads. The loads driven by non-switching buffers 15 and 17 can be loads external to the integrated circuit chip on which output buffer 13 is formed. As such, any noise associated with non-switching buffers 15 and 17 may propagate to other integrated circuits where the noise may result in undesirable consequences. For example, noise superimposed on an otherwise low signal which is intended to prevent an integrated circuit from being reset may be misread as a high signal would result in the inappropriate resetting of the integrated circuit.

Noise associated with output buffer 13 can result when transistors (not shown) of output buffer 13 are switched. While this noise can result from temperature effects, this noise is typically a result of high pin inductance which results when the current flows either from the load $10_{CL}$ to the $V_{SS}$ bus 14, or from the $V_{DD}$ bus 16 to the load $10_{CL}$.

When output signal 22 of output buffer 13 goes low, the noise that results from switching flows through internal transistors (not shown) of non-switching buffer 15, and is manifested in the output signal 25 of non-switching buffer 15 as a departure from the low signal level. This phenomenon is known as "ground bounce." In some cases, the output signal 25 may exhibit "ringing," which is a gradual reduction of the magnitude of ground bounce characteristics.

When output 22 of output buffer 13 goes high, the noise that results from switching transistors associated with output buffer 13 appears in the output signal 27 of non-switching buffer 17 as a departure from the ideal "high" signal level. This phenomenon is referred to as "power-supply droop," or "voltage ($V_{DD}$) bounce."

As will be appreciated by those skilled in the art, if output signal 25 of nonswitching buffer 15 goes high due to ground bounce or ringing when output signal 25 is expected to be low, the effect of a high output signal 25 on any circuitry which uses output 25 may have serious consequences. Similarly, if output signal 27 of non-switching buffer 17 goes low when output signal 27 is expected to be high, the low output 27 may affect circuitry which uses output signal 27. As such, what is needed is a method for controlling the noise in an output buffer.

DISCLOSURE OF THE INVENTION

A low-noise output buffer with noise cancellation feedback circuitry formed on an integrated circuit enables noise associated with voltage and ground supplies to be reduced, thereby minimizing voltage ($V_{DD}$) bounce and ground bounce, respectively, in the signals of the integrated circuit. Minimizing ground bounce and voltage ($V_{DD}$) bounce, in turn, enables the output signal provided by the integrated circuit, which includes the output buffer, to an external integrated circuit to be more accurate.

A low-noise output buffer in accordance with the present invention includes: pre-driver circuitry coupled to core circuitry of an integrated circuit, output circuitry having a variable drive level that is responsive to the pre-driver output signal, such that the output circuitry is coupled to an output of the integrated circuit and is powered by a first power supply, and noise reduction control circuitry coupled to the pre-driver output signal and the first power supply. The noise reduction control circuitry is powered by a second power supply, a "clean power supply," which has less noise than the first power supply, and is arranged to develop a control signal that is coupled to the output circuitry to modify its drive level to counteract noise detected on the first power supply. In some embodiments, the noise reduction control circuitry includes a first transistor and the output circuitry includes a second transistor which are arranged such that the first transistor and the second transistor form a "stacked transistor pair." In such embodiments, the first transistor and the second transistor can be N-type transistors. Alternatively, in such embodiments, the first transistor and the second transistor can be P-type transistors.

A method for reducing power supply noise in an output buffer of an integrated circuit in accordance with the present invention includes: a) developing a pre-driver output signal in response to a pre-driver input, b) routing the pre-driver output signal to power supply noise reduction control circuitry, where the power supply noise reduction control circuitry is powered by a clean power supply, c) developing a control signal on the power supply noise reduction control circuitry which includes a transistor that is "stacked" with a transistor in the output circuitry, and d) modifying the drive level of the output circuitry to counteract noise detected on the output circuitry power supply.

In some embodiments of the method of the present invention, modifying the drive level of the output circuitry to counteract noise detected on the output circuitry power supply includes determining if the power supply noise exceeds a threshold voltage associated with an additional transistor that is a part of the power supply noise reduction control circuitry, and turning on the additional transistor when the power supply noise exceeds the threshold voltage. Turning on the additional transistor modifies the drive level of the output circuitry.

The present invention provides an improved method for reducing power supply noise in an output buffer of an integrated circuit. By providing noise reduction control circuitry and pull-up output circuitry in an output buffer, ground bounce and voltage ($V_{DD}$) bounce at outputs of an integrated circuit can be greatly reduced.

These and other advantages of the present invention will become apparent upon reading the following detailed descriptions and studying the various figures of the drawings.

BRIEF DESCRIPTION OF THE DRAWINGS

FIG. 4a is a graph illustrating a simulated response, as measured at an output pad and at a ground node of a conventional output buffer of FIG. 1, to a voltage input.

FIG. 4b is a graph illustrating a simulated response, as measured at the output pad and the ground node, of the low-noise output buffer of FIG. 3 to a voltage input.

BEST MODES FOR CARRYING OUT THE INVENTION

Figure 1:
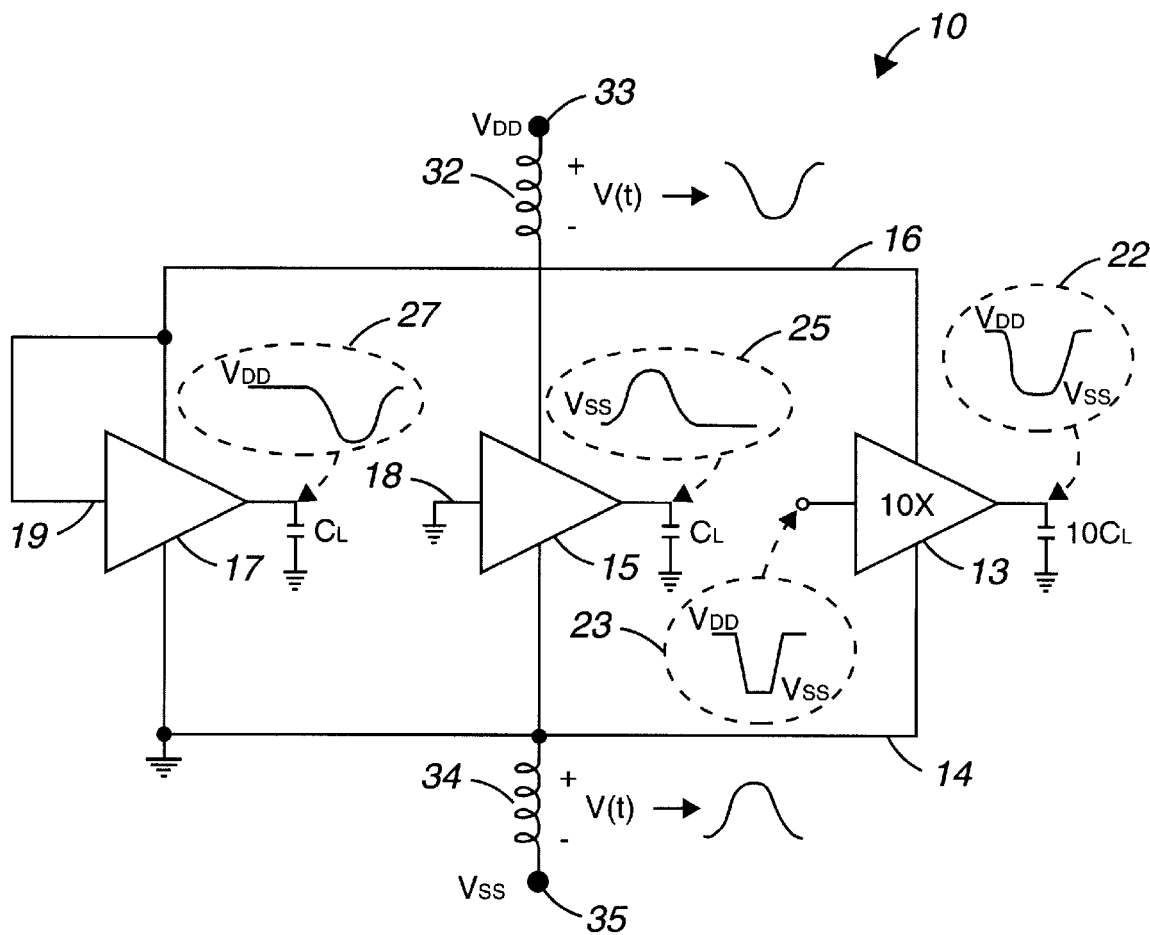
FIG. 1 is a diagram of a conventional output buffer for an integrated circuit.
Figure 2:
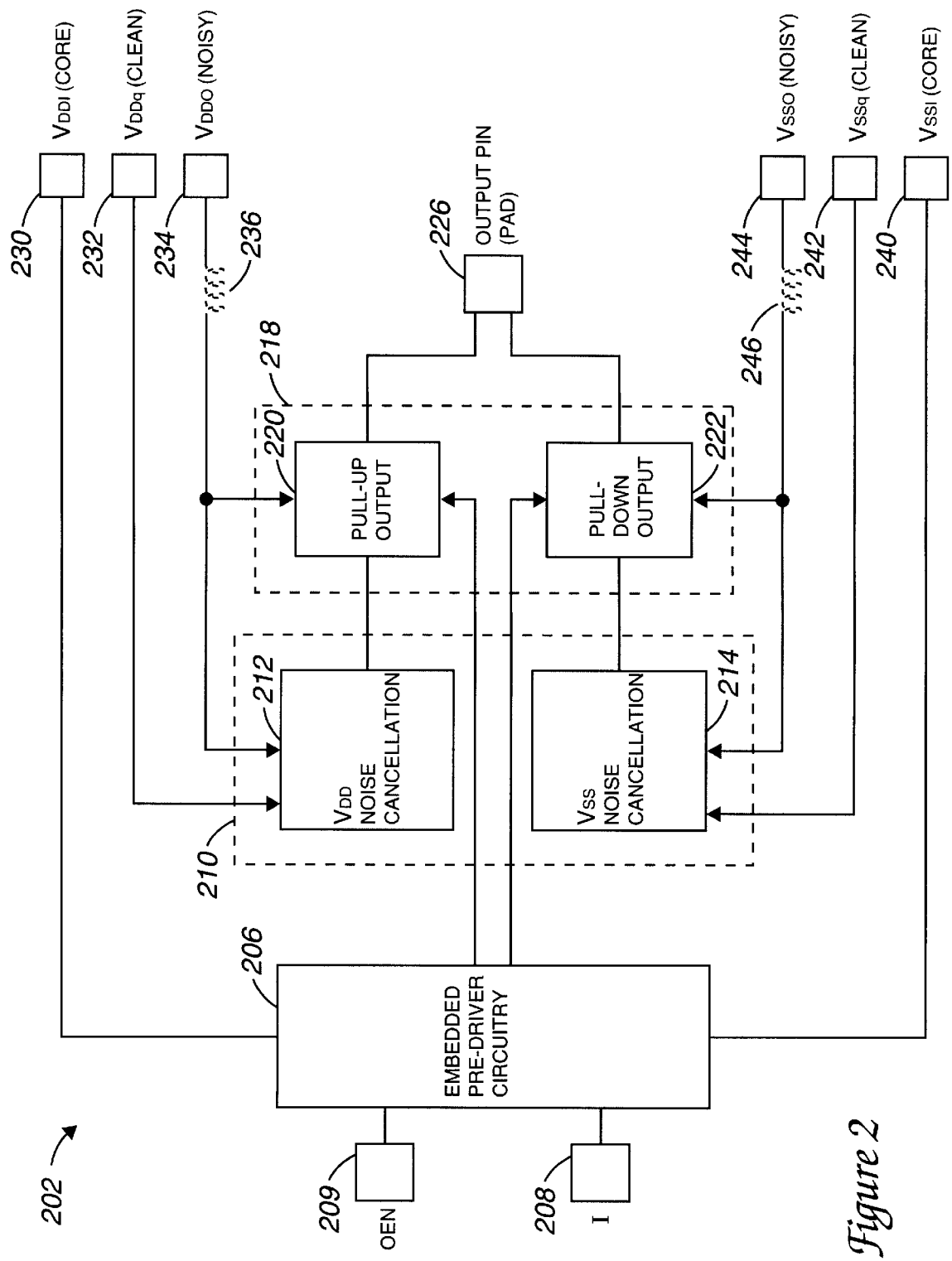
FIG. 2 is block diagram of a low-noise output buffer for an integrated circuit in accordance with the present invention.

FIG. 1 is a diagram of a prior art input/output (I/O) buffer for an integrated circuit and was discussed previously. FIG. 2 is a block diagram of a low-noise output buffer 202 for an integrated circuit in accordance with the present invention. The low-noise output buffer 202 is generally part of a low-noise input/output buffer on an integrated circuit, and includes embedded pre-driver circuitry 206. Embedded pre-driver circuitry 206 typically also includes enabling circuitry, which "enables" low-noise output buffer 202. An output enable signal (OEN) 209 and an input signal (I) 208 are inputs to embedded pre-driver circuitry 206. OEN signal 209 and I signal 208 are developed by "core circuitry" of the integrated circuit of which buffer 202 is apart. Embedded pre-driver circuitry 206 develops transitional signals in response to OEN signal 209 and I signal 208.

Low-noise output buffer 202 includes noise cancellation circuitry 210 which, in the embodiment as shown, includes a voltage supply ($V_{DD}$) noise ("droop") cancellation circuit 212 and a ground ($V_{SS}$) noise ("bounce") cancellation circuit 214. That is, transitional signals generated by embedded pre-driver circuitry 206 are provided as inputs to noise cancellation circuitry 210. Transitional signals generated by embedded pre-driver circuitry 206 are sent to output circuitry 218 that can include pull-up output circuitry 220 and pull-down output circuitry 222, as shown. Pull-up output circuitry 220 and pull-down output circuitry 222 are further connected to $V_{DD}$ noise cancellation circuitry 212 and $V_{SS}$ noise cancellation circuitry 214, respectively. An output pin, or pad, 226 of low-noise output buffer 202 is connected to output circuitry 218 and carries output signals that are generated by output circuitry 218 using transitional signals produced by both embedded predriver circuitry 206 and noise cancellation circuitry 210. It should be appreciated typically, output pin 226 drives a load (not shown).

Embedded pre-driver circuitry 206 is powered by a core power supply which comprises a core voltage ($V_{DDI}$) 230 and a core ground ($V_{SSI}$) 240. Noise cancellation circuitry 210 is coupled to a clean power supply that comprises a clean voltage ($V_{DDq}$) 232 and a clean ground ($V_{SSq}$) 242. $V_{DDq}$ 232 and $V_{SSq}$ 242 are important as they serve as a reference voltage and a reference ground, respectively, for noise feedback comparisons. $V_{DDq}$ 232 and $V_{SSq}$ 242 are clean power lines in that they carry low currents and, hence, generate relatively low level of noise. As such, $V_{DDq}$ 232 and $V_{SSq}$ 242 are dedicated to noise cancellation block 210. "Noisy" voltage and ground signals come from $V_{DDO}$ 234 and $V_{SSO}$ 244.

The noisy signals are the signals that are subject to feedback into noise cancellation block 210. The noise on the voltage and ground signals are a result of pin inductance associated with the metal lines of the voltage and ground pins. The pin inductance is essentially the result of parasitic inductances of the voltage and ground pins. Parasitic inductances 236, 246 are associated with $V_{DDO}$ 234 and $V_{SSO}$ 244 lines, respectively. $V_{DDO}$ 234 and $V_{SSO}$ 244 lines carry relatively high currents which have a tendency to fluctuate greatly. Hence, $V_{DDO}$ 234 and $V_{SSO}$ 244 lines are noisy. In the embodiment as shown, $V_{DDO}$ 234 and $V_{SSO}$ 244 are sensed by noise cancellation circuitry 210. Noise cancellation circuitry 210 then generates signals in response to $V_{DDO}$ 234 and $V_{SSO}$ 244, and puts the signals through to output circuitry 218.

It should be appreciated that this fluctuation of the current in conjunction with an overall high current generally causes noise. By way of example, ground bounce generally occurs when the rate of change of discharge current through the pin inductance associated with $V_{SSO}$ 244 is high. Similarly, voltage ($V_{DD}$) bounce generally occurs when the rate of change of discharge current through the pin inductance associated with $V_{DDO}$ 234 is high. On the other hand, while $V_{DDq}$ 232 and $V_{SSq}$ 242 may are associated with low currents, as the currents are relatively consistent, $V_{DDq}$ 232 and $V_{SSq}$ 242 are considered to be "clean," i.e. they exhibit very little noise, ringing, and other transients or porasities.

Figure 3:
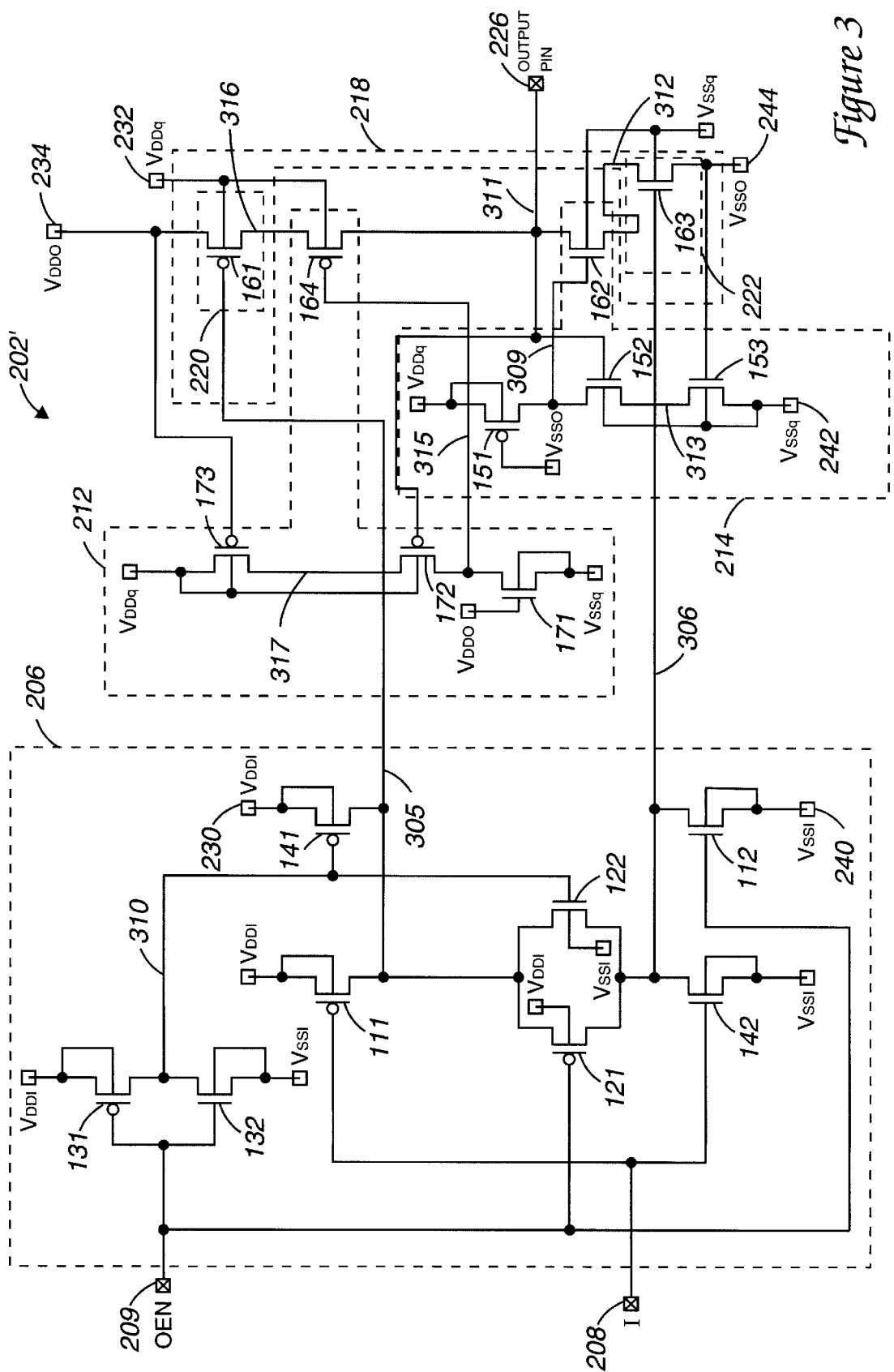
FIG. 3 is a schematic of a low-noise output buffer corresponding to the block diagram of FIG. 2.

FIG. 3 is a circuit diagram which represents one embodiment of the low-noise output buffer of FIG. 2. A low-noise output buffer circuit 202' includes embedded pre-driver circuitry 206 which is comprised of transistors 111, 112, 121, 122, 131, 132, 141, and 142. Embedded pre-driver circuitry 206 takes as inputs the output enable signal 209 and an input signal 208, as described above with respect to FIG. 2. As shown, transistors 111, 121, 131, and 141 are preferably PMOS, or p-type, transistors, while transistors 112, 122, 132, and 142 are preferably NMOS, or n-type, transistors. Transistors 111 and 142 comprise the actual pre-driver of embedded pre-driver circuitry 206, and serve to process input signal 208. Transistors 112, 121, 122, 131, 132, and 141 comprise enabling circuitry that is used to process output enable signal 209.

In order to enable output buffer circuit 202', output enable signal 209 is switched from "high" to "low". In the described embodiment, $V_{SSI}$ 240, $V_{SSq}$ 242, and $V_{SSO}$ 244 have values which are less than one volt, and, more preferably, approximately zero, as $V_{SSI}$ 240, $V_{SSq}$ 242, and $V_{SSO}$ 244 all provide ground signals. On the other hand, $V_{DDI}$ 230, $V_{DDq}$ 232, and $V_{DDO}$ 234 all have nominal values of more than about two volts and, more preferably, approximately three volts. Hence, as used herein, a low signal is generally a signal which has a value of less than about one volt and, more preferably, approximately zero volts, while a high signal is generally a signal which has a value of more than $V_{DD}$-1 volts, and, more preferably, approximately $V_{DD}$ volts. Therefore, switching a signal from high to low refers to switching a signal from approximately three volts to approximately zero volts in this example. When output enable signal 209 goes low, or transitions to a low signal, transistor 131 is turned on while transistor 132 is turned off. With transistor 131 on while transistor 132 is off, node 310, which is also referred to as line 310, is pulled high. In other words, transistor 131 pulls node 310 high, specifically up to the value of $V_{DDI}$ 230. When node 310 goes high, transistor 141 is turned off and transistor 122 is turned on. Transistors 121 and 112 are also affected when output enable signal 209 transitions to a low signal. Specifically, transistor 121 is turned on and transistor 112 is turned off.

When input pin 208 is high, transistors 111 and 142 are affected. In particular, when input pin 208 is switched from high to low, transistor 111 is turned on, and transistor 142 is turned off. While transistor 111 is on, line 305 is pulled up. It should be appreciated that with transistor 141 off, line 305 is largely unaffected by transistor 141. Further, transistor 111 and transistor 142 cooperate to pull up line 306, through transistors 121 and 122. With transistors 121 and 122 both on, and transistor 112 off, line 306 is pulled up. Herein, transitional lines 305 and 306 will also be referred to as "pre-driver output nodes 305 and 306."

$V_{DD}$ noise cancellation circuitry 212 includes p-type transistors 164, 172, and 173, as well as n-type transistor 171. Transistor 172 is on when output pin 226 is low. As output pin 226 is initially low in response to a transition from low to high that is made by overall input 208, transistor 172 is initially on. Transistor 172 turns off when output pin 226 completes a transition from low to high, and turns on when output pin 226 completes a transition from high to low. While output pin 226 is high, the voltage noise on the $V_{DDO}$ 234 line that is caused by other circuitry, e.g. another output buffer, which uses the $V_{DDO}$ 234 line will have little or no affect on the node voltage at line 315.

Transistor 173 generally senses noise on the $V_{DDO}$ 234 node. When a threshold voltage, or the maximum acceptable voltage difference between voltage $V_{DDO}$ 234 and voltage $V_{DDq}$ 232, is reached, transistor 173 turns on and pulls up the voltage at line 315, if transistor 172 is also on. Although the threshold voltage may take on any appropriate value, a threshold voltage of about 0.7 volts is typical for silicon transistors. In general, the threshold voltage is set such that when the difference between voltages $V_{DDO}$ 234 and $V_{DDq}$ 232 is below the threshold voltage, the noise in the $V_{DDO}$ 234 line is generally considered to be insignificant. As such, when the threshold voltage is not exceeded, transistor 173 does not turn on.

The gate of transistor 171 is tied to $V_{DDO}$ 234, as shown. As a result, transistor 171 is always on. Initially, in the described embodiment, transistor 173 is off due to the fact that there is no noise, and $V_{DDO}$ 234 is at approximately a three volt level in this example. Transistor 171 pulls down line 315 to $V_{SSq}$ 242 when transistor 172 is on and transistor 173 is off. When line 315 is pulled down, i.e. low, transistor 164 is turned on.

In the described embodiment, the size of transistor 171 is small compared to transistors 172 and 173. By way of example, the size of transistor 171, e.g. its gate width, may be an order of magnitude smaller that the size of transistors 172 and 173. The relative sizes of transistors 171, 172, and 173 are chosen such that when transistors 172 and 173 are on, the voltage at line 315 may be pulled up without much difficulty. Hence, during the transition when transistors 172 and 173 are on, the gate voltage of transistor 164, which is the voltage at line 315, goes high. Consequently, as transistor 164 is weakened, the current flowing through transistor 164 from $V_{DDO}$ 234 to output pin 226 is limited, i.e. reduced. The actual high value reached on node 315 when node 315 goes high is dependent upon the size ratio between transistors 172 and 173, with transistor 171. It should be appreciated, however, that the actual high value reached on node 315 can also depend upon $V_{DDO}$ 234, or the voltage ($V_{DD}$) bounce associated with $V_{DDO}$ 234, which is connected to the gates of transistors 171 and 173.

Transistor 164 serves to connect a pull-up output transistor 161 with output pin 226. Together, transistor 161 and transistor 164 comprise a stacked transistor pair. As will be appreciated by those skilled in the art, a stacked transistor pair is a pair of transistors which are connected in series. The gate voltage of transistor 164, which is the voltage at line 315, moves up or increases when transistors 172 and 173 are momentarily on. This increase in voltage at line 315 reduces the current that charges from the $V_{DDO}$ 234 line to the load capacitance (not shown) at output pin 226. It should be appreciated that reducing the rate of change of current in the $V_{DDO}$ 234 line, or pin, reduces the overall noise on the $V_{DDO}$ 234 line. As will be discussed below, when line 306 goes high, transistor 163 turns on.

In the embodiment as shown, $V_{SS}$ noise cancellation circuitry 214 includes NMOS transistors 152, 153, and 162, as well as PMOS transistor 151. Transistor 152 is on when output pin 226 is high. As output pin 226 is initially high in response to a transition from high to low that is made by overall input 208, transistor 152 is initially on. Transistor 152 turns off when output pin 226 completes a transition from high to low. While output pin 226 is low, the ground noise on the $V_{SSO}$ 244 line that is caused by other circuitry, e.g. another output buffer, which uses the $V_{SSO}$ 244 line will have little or no affect on the node voltage at line 309.

Transistor 153 generally senses ground noise on the $V_{SSO}$ 244 line. When a ground threshold voltage, or the maximum acceptable voltage difference between voltage $V_{SSO}$ 244 and voltage $V_{SSq}$ 242, is reached, transistor 153 turns on and pulls down the voltage at line 309, if transistor 152 is also on. Although the maximum acceptable voltage difference between voltage $V_{SSO}$ 244 and voltage $V_{SSq}$ 242, i. e. the ground threshold voltage, may take on any appropriate value, a threshold voltage of no more than approximately 0.7 Volts is preferred. In general, the ground threshold voltage is set such that when the difference between voltages $V_{SSO}$ 244 and $V_{SSq}$ 242 is below the ground threshold voltage, the ground noise in the $V_{SSq}$ 242 line is generally considered to be insignificant. As such, when the ground threshold voltage is not exceeded, transistor 153 does not turn on.

The gate of transistor 151 is tied to the ground, or $V_{SSO}$ 244, as shown. As such, transistor 151 is always on. Initially, transistor 153 is off due to the fact that there is no noise, and $V_{SSO}$ 244 is at approximately a zero volt level. Transistor 151 pulls up line 309 to $V_{DDq}$ 232 when either one of or both transistor 152 and transistor 153 are off. When line 309 is pulled up, i.e. high, transistor 162 is turned on.

In the described embodiment, the size of transistor 151 is small compared to transistors 152 and 153, just as the size of transistor 171 is small compared to transistors 172 and 173. By way of example, the size of transistor 151 may be an order of magnitude smaller that the size of transistors 152 and 153. Again, the relative sizes of transistors 151, 152, and 153 are such that the voltage at line 309 may be pulled down without much difficulty. Hence, during the transition when transistors 152 and 153 are on, the gate voltage of transistor 162, which is the voltage at line 309, goes low. Consequently, as transistor 162 is weakened, the current flowing through transistor 162 from output pin 226 to $V_{SSO}$ 244 is limited, i.e. reduced. The actual low value reached on line 309 when line 309 goes low is dependent upon the size ratio between transistors 152 and 153, with transistor 151. It should be appreciated, however, that the actual low value reached on line 309 can also depend upon $V_{SSO}$ 244, or the ground bounce associated with $V_{SSO}$ 244, which is connected to the gates of transistors 151 and 153.

Transistor 162 serves to connect a pull-down output transistor 163 with output pin 226. Together, transistor 162 and transistor 163 comprise a stacked transistor pair as described previously. The gate voltage of transistor 162, which is the voltage at line 309, "dips," or drops, when transistors 152 and 153 are momentarily on. This drop in voltage at line 309 reduces the current that discharges from the load capacitance (not shown) at output pin 226 to the $V_{SSO}$ 244 line. It should be appreciated that reducing the rate of change of current into the $V_{SSO}$ 244 line, or pin, reduces overall ground noise on the $V_{SSO}$ 244 line. In other words, the drive level of output pin 226 is modified to counteract ground noise. In general, the relationship between ground noise and the rate of change of current may be expressed as: ti $V_S = L di/dt$ where $V_S$ is the ground noise, L is the ground line inductance, and di/dt is the rate of change of current.

In addition to embedded pre-driver circuitry 206 and noise cancellation block 210, output buffer circuit 202' further includes output circuitry 218. In the embodiment as shown, output circuitry 218 comprises pull-up output circuitry 220 and pull-down output circuitry 222. Pull-up output circuitry 220 comprises a p-type transistor 161, while pull-down output circuitry 222 comprises an n-type transistor 163. Transistors 161 and 162 are used in part to provide output buffer circuit 202' with five volt tolerance capabilities. In three volt technology, transistors, like the transistors used in output buffer circuit 202', are typically made in such a way that five volts cannot be tolerated. When such transistors are exposed to five volts, the gates of the transistors can rupture. In some cases, burnout of the transistors may occur. As some lines in output buffer circuit 202' may be common to other circuits, as for example another buffer circuit, which use five volt technology, building in five volt tolerance capabilities protects gates of transistors in output buffer circuit 202' from rupturing.

Pull-up output circuitry 220 comprises transistor 161 which, together with transistor 164, makes up a stacked transistor pair. When node 305 goes low, transistor 161 turns on. Once transistor 161 turns on, current to the load (not shown) that is connected to output pin 226 begins to flow from $V_{DDO}$ 234 line through transistors 161 and 164, thereby creating voltage ($V_{DD}$) bounce on $V_{DDO}$ 234 line. When the voltage bounce is higher than the threshold voltage associated with transistor 173, as for example higher than approximately 0.7 volts, transistor 173 turns on as described above.

Pull-down output circuitry 222 comprises transistor 163. As previously described, transistors 163 and 162 comprise a stacked transistor pair. When line 306 goes high, transistor 163 begins to turn on, and sinks current from the load (not shown) that is connected to output pin 226. This current from the load begins flowing from output pin 226 through transistor 162 and transistor 163 into $V_{SSO}$ 244 line, thereby creating ground bounce on $V_{SSO}$ 244 line. When the ground bounce voltage is higher than the threshold voltage associated with transistor 153, transistor 153 turns on. As previously mentioned, a suitable threshold value is approximately 0.7 volts. Once transistor 153 is on, it will start to pull line 309 lower, because transistors 152 and 153 are on.

Noise, e.g. ground bounce, is reduced when the gate voltage of transistor 162, i.e. line 309, which is normally high, dips when transistors 152 and 153 are momentarily turned on, as described above. When the voltage on line 309 dips, the current discharging from any load capacitance at output pin 226 to $V_{SSO}$ 244 line is reduced. This reduction in discharging current reduces the rate of change of current into $V_{SSO}$ 244 line, thereby reducing ground noise. Similarly, voltage ($V_{DD}$) bounce is reduced when the gate voltage of transistor 164, i.e. line 315, which is normally low, rises when transistors 172 and 173 are momentarily turned on, as previously described. When the voltage on line 315 rises, the current charging from $V_{DDO}$ 234 line to the load capacitance at output pin 226 is reduced. Therefore, the rate of change of current into $V_{DDO}$ 234 line is reduced. As a result, voltage ($V_{DD}$) bounce, and overall voltage noise, is reduced.

FIG. 4a is a graph illustrating a simulated response of a conventional output buffer (such as shown in FIG. 1) to a voltage input, as measured at an output pad and at a ground node. Specifically, FIG. 4a is a graph which illustrates the time response of the output of a conventional output buffer without noise cancellation circuitry, as well as the time response of a voltage line with noise, for a declining ramp input to the output buffer. The conventional output buffer is essentially the output buffer of FIG. 3, without noise cancellation circuitry 212 or 214. Plot 400 is a simulation performed using an HSPICE simulation package available from Avanti Corporation. As shown, the simulation is performed over a thirty nanosecond (ns) time period. An input 404 from an input buffer to an output buffer, i.e. an output buffer without noise cancellation circuitry, is shown as a declining ramp input. In response to input 404, a ground voltage line output 408, which includes noise, increases from an initial ground level of approximately zero volts, and displays ground bounce with some ringing. As shown, the ground bounce on ground voltage line output 408 reaches a peak value of approximately 2.5 volts, with an overall swing of over 5 volts. Also, the ringing in the voltage on ground voltage line output 408 appears to continue past the thirty nanosecond mark.

The output voltage 412 measured at the output of the conventional output buffer begins at approximately 3.6 volts, increases to approximately 4 volts in response to input 404, then follows the response of ground voltage line 408. Hence, the noise on ground voltage line output 408, as evidenced by ground bounce and ringing, affects output voltage 412 by inhibiting output voltage 412 from quickly reaching a steady state value.

FIG. 4b is a graph illustrating the response of output buffer 202' (FIG. 3) of the present invention to a voltage input, as measured at output pad 226 and at ground node $V_{SSO}$ 244. Plot 450 is a simulation performed using the HSPICE simulation package mentioned above, and is performed over a thirty nanosecond (ns) time period. Input 454, which is the input to output buffer 202' from overall input signal 208 is shown as a declining ramp input. In response to input 454, a ground voltage 458, which is read on ground node V$_{SSO}$ 244, increases from an initial ground level of approximately zero volts, and displays a small amount of ground bounce with a miximal amount ringing. As shown, the magnitude of the ground bounce on ground voltage line output 458 is approximately 1.5 volts, and the ringing in the voltage on ground voltage line output 458 appears to be negligible past the thirty nanosecond mark. The magnitude of ground bounce on ground voltage line output 458 is significantly less than the ground bounce that is evident on ground voltage line output 408 of the conventional output buffer.

The output voltage 462 measured at output pin 226 of output buffer 202' begins at approximately 3.6 volts, increases to approximately 4 volts in response to input 454, then follows the response of ground voltage line 408. Therefore, as the noise on ground voltage line output 458 quickly approaches a steady state value, output voltage 462 also rapidly approaches a steady state value. Further, the magnitude of ground bounce and ringing is reduced in output voltage 462 to a swing of approximately 5.5 volts, and the magnitude of ground bounce and ringing is reduced in ground voltage line output 458 to a swing of approximately 3 volts.

As shown, output voltage 462 of FIG. 4b approaches a steady state value more rapidly than output voltage 412 of FIG. 4a. This is a direct result of the fact that the amount of noise exhibited in output voltage 412 of the conventional output buffer is greater than the amount of noise exhibited by the low noise output buffer. Ground voltage line 458 of FIG. 4b exhibits a lower magnitude of noise, as well as a more rapid approach to a steady state value than ground voltage line 408 of FIG. 4a. The magnitude difference, as evidenced in FIGS. 4a and 4b, is on the order of approximately one volt, which is significant. As such, it is clear that the low noise output buffer significantly reduces noise on ground and output voltage lines.

While this invention has been described in terms of several preferred embodiments, there are alterations, permutations, and equivalents which fall within the scope of this invention. It should also be noted that there are many alternative ways of implementing both the process and apparatus of the present invention. It is therefore intended that the following appended claims be interpreted as including all such alterations, permutations, and equivalents as fall within the true spirit and scope of the present invention.

We claim:

1. An output buffer comprising:
    pre-driver circuitry for receiving a pre-driver input developed by core circuitry of an integrated circuit, said pre-driver circuitry arranged to develop a pre-driver output signal;
    means for outputting having a variable drive level that is responsive to said pre-driver output signal, said means for outputting being coupled to an output of said integrated circuit and being powered by a first power supply; and
    means for controlling noise reduction coupled to said first power supply, said means for controlling noise reduction being powered by a second power supply which has less noise than said first power supply, said means for controlling noise reduction arranged to develop a control signal that is coupled to said means for outputting to modify said drive level of said means for outputting to counteract noise detected on said first power supply, wherein said means for controlling noise reduction includes a first transistor and said means for outputting includes a second transistor, said first transistor and said second transistor being connected in series.

2. An output buffer according to claim 1 wherein said second transistor is coupled to said output of said integrated circuit through said pre-driver circuitry, and said first transistor is further coupled to said second power supply.

3. An output buffer comprising:
    pre-driver circuitry receiving a pre-driver input developed by core circuitry of an integrated circuit, said pre-driver circuitry developing a pre-driver output signal that is responsive to signals developed on said pre-driver input by said core circuitry;
    output circuitry having a variable drive level that is responsive to said pre-driver output signal, said output circuitry being coupled to an output pin of said integrated circuit and being powered by an output circuitry power supply; and
    power supply noise reduction control circuitry having inputs coupled to said output circuitry power supply, said power supply noise reduction control circuitry being powered by a clean power supply which has less noise than said output circuitry power supply, said power supply noise reduction control circuitry developing a control signal that is coupled to said output circuitry to modify said drive level of said output circuitry to counteract noise detected on said output circuitry power supply, wherein said power supply noise reduction control circuitry includes a first transistor and said output circuitry includes a second transistor, said first transistor and said second transistor being connected in series.

4. An output buffer according to claim 3 wherein:
    said first transistor and said second transistor are N-type transistors, said first transistor including a gate, a drain, a body, and a source, said second transistor including a gate, a drain, a body, and a source; and
    said body of said first transistor and said body of said second transistor are coupled to said clean power supply.

5. An output buffer according to claim 4 wherein:
    said gate of said first transistor is coupled to said pre-driver output signal;
    said source of said first transistor is coupled to said output circuitry power supply; and
    said drain of said first transistor is coupled to said source of said second transistor.

6. An output buffer according to claim 5 wherein:
    said gate of said second transistor is coupled to said control signal; and
    said drain of said second transistor is coupled to said output pin of said integrated circuit.

7. An output buffer according to claim 3 wherein:
    said first transistor and said second transistor are P-type transistors, said first transistor including a gate, a drain, a body, and a source, said second transistor including a gate, a drain, a body, and a source; and
    said body of said first transistor and said body of said second transistor are coupled to said clean power supply.

8. An output buffer according to claim 7 wherein:
    said gate of said first transistor is coupled to said pre-driver output signal;
    said drain of said first transistor is coupled to said output circuitry power supply; and said source of said first transistor is coupled to said drain of said second transistor.

9. An output buffer according to claim 8 wherein:

said gate of said second transistor is coupled to said control signal; and said source of said second transistor is coupled to said output pin of said integrated circuit.

10. A method for reducing power supply noise in an output buffer comprising:

developing a pre-driver output signal in response to a pre-driver input;

routing said pre-driver output signal to an output circuitry powered by an output circuitry power supply;

developing a control signal on a power supply noise reduction control circuitry, said noise reduction control circuitry being powered by a clean power supply, said noise reduction control circuitry including a first transistor, said control signal being coupled to said output circuitry powered by said output circuitry power supply and having a variable drive level, said output circuitry being responsive to said pre-driver output signal, said output circuitry including a second transistor, wherein said first transistor and said second transistor are stacked; and modifying said drive level of said output circuitry to counteract noise detected on said output circuitry power supply.

11. A method for reducing power supply noise as recited in claim 10 further including receiving said pre-driver input from core circuitry of an integrated circuitry.

12. A method for reducing power supply noise as recited in claim 10 wherein modifying said drive level of said output circuitry to counteract noise detected on said output circuitry power supply includes:

determining if said power supply noise exceeds a threshold voltage, said threshold voltage being associated with a third transistor, said third transistor being a part of said power supply noise reduction control circuitry; and turning on said third transistor when said power supply noise exceeds said threshold voltage, wherein turning on said third transistor modifies said drive level of said output circuitry.

13. A method for reducing power supply noise as recited in claim 12 wherein said threshold voltage is approximately 0.7 volts.

14. A method for reducing power supply noise as recited in claim 12 including:

a fourth transistor that is a part of said power supply noise reduction control circuitry, said fourth transistor being connected to said third transistor, said fourth transistor being coupled to said output circuitry; and a fifth transistor that is a part of said power supply noise reduction control circuitry, said fifth transistor being connected to said first transistor and said fourth transistor, wherein said fourth transistor and said third transistor are larger than said fifth transistor.

15. A method for reducing power supply noise as recited in claim 10 wherein said output circuitry power supply has more noise than said clean power supply powering said noise reduction control circuitry.

* * * * *

UNITED STATES PATENT AND TRADEMARK OFFICE
CERTIFICATE OF CORRECTION

PATENT NO.    : 5,917,361
DATED         : June 29, 1999
INVENTOR(S)   : Jeffrey F. Wong & Wassem Ahmad It is certified that error appears in the above-identified patent and that said Letters Patent is hereby corrected as shown below:

Column 2,
Line 16, reads "signal 25 of nonswitching buffer 15 goes high due to ground", it should read: -- signal 25 of non-switching buffer 15 goes high due to ground --;

Column 3,
Line 55, reads "integrated circuit of which buffer 202 is apart. Embedded" it should read: -- integrated circuit of which buffer 202 is a part. Embedded --;

Column 4,
Line 7, reads "produced by both embedded predriver circuitry 206 and" it should read: -- produced by both embedded pre-driver circuitry 206 and --;

Column 6,
Line 50, reads "between voltage Vsso 244 and voltage Vssq 242, i. e. the" it should read: -- between voltage Vsso 244 and voltage Vssq 242, i.e. the --;

Column 7,
Line 32 in the equation, "ti Vs=Ldi/dt" it should read: -- ti Vs=L di/dt --; and Column 9,
Line 5, reads "ground bounce with a miximal amount of ringing. As shown," it should read: -- ground bounce with a minimal amount of ringing. As shown, --.

Signed and Sealed this

Eleventh Day of December, 2001

*Attest:*

NICHOLAS P. GODICI
*Attesting Officer*    *Acting Director of the United States Patent and Trademark Office*